United States Patent [19]

Leipold et al.

[11] Patent Number: 5,172,290

[45] Date of Patent: Dec. 15, 1992

[54] GATE-SOURCE PROTECTIVE CIRCUIT FOR A POWER MOSFET

[75] Inventors: Ludwig Leipold; Jenoe Tihanyi; Roland Weber; Rainald Sander, all of Munich, Fed. Rep. of Germany

[73] Assignee: Siemens Aktiengesellschaft, Berlin and Munich, Fed. Rep. of Germany

[21] Appl. No.: 382,523

[22] Filed: Jul. 20, 1989

[30] Foreign Application Priority Data

Aug. 10, 1988 [DE] Fed. Rep. of Germany ....... 3827164

[51] Int. Cl.$^5$ .............................................. H02H 9/04
[52] U.S. Cl. ........................................ 361/56; 361/91; 361/111
[58] Field of Search .................... 361/56, 86, 91, 111; 357/23.13; 307/296.4, 296.5

[56] References Cited

U.S. PATENT DOCUMENTS

| | | | |
|---|---|---|---|
| 4,160,923 | 7/1979 | Maeda et al. | 361/56 X |
| 4,777,518 | 10/1988 | Mihara et al. | 361/56 X |
| 4,829,344 | 5/1989 | Bartoffi et al. | 357/23.13 |

OTHER PUBLICATIONS

"Untersuchungen An Einem Neuen Mosfet-Modul", Lorenz et al., 3rd Int. Macroelectronics Conference, Munich, Nov. 13, 1986, pp. 68-84.

*Primary Examiner*—Todd E. DeBoer
*Attorney, Agent, or Firm*—John F. Moran; Joseph S. Codispoti

[57] ABSTRACT

The gate-source capacitance of a power MOSFET (1) can be protected against positive and negative excess voltages by two integrated Zener diodes (3, 4) the anodes of which are coupled to each other and the cathodes of which are respectively coupled to the gate and source terminals of the power MOSFET. However, when a control voltage is applied, the parasitic bipolar transistor associated with one of the Zener diodes is switched on and prevents the MOSFET from completely switching on. The parasitic bipolar transistor is rendered harmless by the fact that the anode terminal is coupled to a source terminal (S) MOSFET (1) when a gate-source voltage is applied.

3 Claims, 2 Drawing Sheets

GATE-SOURCE PROTECTIVE CIRCUIT FOR A POWER MOSFET

BACKGROUND OF THE INVENTION

This invention relates to a circuit arrangement with a power MOSFET and two Zener diodes the anodes of which are coupled to each other, whereby the cathode terminal of the first Zener diode is coupled to the gate terminal, and the cathode terminal of the second Zener diode is coupled to the source terminal of the power MOSFET.

This circuit is described, for example, in a paper entitled "Untersuchungen an einem neuen MOSFET Modul" by L. Lorenz, W. Schierz, H. Amann, 3rd International Macroelectronics Conference, Munich, Nov. 13, 1986, pages 68 to 84. The circuit is illustrated in FIG. 1. Two Zener diodes 3 and 4 are connected between gate terminal G and source terminal S of a power MOSFET 1. They protect the gate-source capacitance of MOSFET 1 against excessive positive and negative voltages.

If MOSFET 1 is connected in series with a load 2 at the source end, then the gate-source voltage $U_{GS}$ must be higher than the supply voltage $V_{BB}$ in order to safely make MOSFET 1 conducting. If Zener diodes 3 and 4 are integrated into a common substrate, it cannot be assured that MOSFET 1 will be made conducting. The current versus voltage characteristic of $I_{GS}$ vs. $U_{GS}$ then has the shape illustrated in FIG. 2. With an increase in current $I_{GS}$ the voltage $U_{GS}$ first increases to the value of the Zener voltage of Zener diode 3 plus the forward voltage of Zener diode 4, e.g., to 6.7 volts. With a further increase in current the voltage drops back to a value of 4 V, for example, and then increases again only when there is a higher current. However, MOSFET 1 frequently cannot be rendered completely conducting with a voltage of 4 V.

The characteristic shown here is produced by switching on the parasitic bipolar transistor associated with Zener diode 3.

This behavior will now be explained with reference to FIG. 3. Zener diodes 3 and 4 includes a region 11 embedded in a semiconductor substrate 10 and zones 12 and 13 which are embedded in region 11. Region 11 as well as zones 12 and 13 are highly doped. Both Zener diodes have a parasitic bipolar transistor formed by zones 13, 11, 10 and 12, 11, 10. The parasitic npn bipolar transistor associated with Zener diode 3 is symbolically illustrated in this figure as transistor 14. If a positive potential which is required to switch on power MOSFET 1 and which must always be higher than the source potential is applied to gate terminal G, the collector of the parasitic bipolar transistor 14 is formed by zone 12, its base is formed by region 11 and its emitter is formed by substrate 10. The base of bipolar transistor 14 can float at a potential higher than the drain potential. Then the parasitic bipolar transistor 14 is rendered conducting and the full voltage cannot build up on Zener diode 3.

SUMMARY OF THE INVENTION

It is an object of the present invention to provide a circuit of the type described above such that switching on of the parasitic bipolar transistor of the aforementioned Zener diode is prevented when a voltage that makes the MOSFET conducting is applied to the input of the power MOSFET.

This object is achieved by two Zener diodes, the anodes of which are coupled to each other and the cathodes of which are coupled to the gate terminal and the source terminal of the power MOSFET and by an electronic switch which is arranged between the anode terminals of the Zener diodes and the source terminal of the power MOSFET. This switch couples the anode terminals and the source terminal when the potential at the gate terminal is higher than that at the source terminal and at the drain terminal.

BRIEF DESCRIPTION OF THE DRAWING

Additional features of the invention and additional objects of the invention will be more readily appreciated and better understood by reference to the following detailed description which should be considered in conjunction with the drawing.

DETAILED DESCRIPTION

Figure 4:
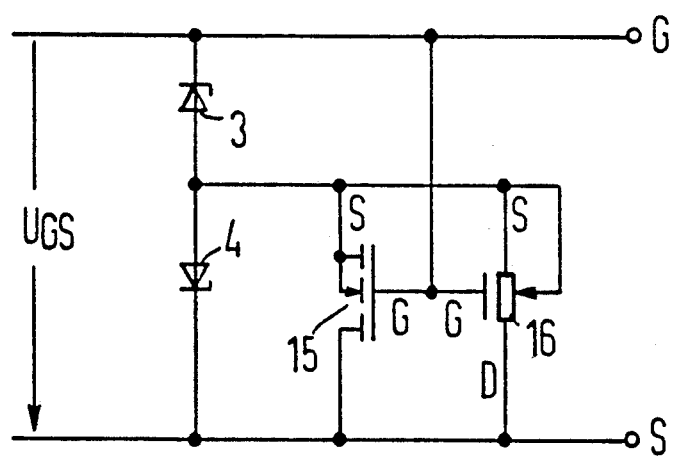
FIG. 4 depicts the gate-source protective circuit according to the invention.

FIG. 4 shows the two Zener diodes 3, 4 coupled to each other at their anode sides. The Zener diodes 3, 4 are arranged between the gate terminal G and the source terminal S. Power MOSFET 1 has been omitted here for the sake of simplicity. The anode terminals of the Zener diodes 3, 4 are coupled to the source terminal S of power MOSFET 1 through an electronic switch. In the simplest case the electronic switch may be an enhancement FET 15 whose source terminal is coupled to the anode terminals of the Zener diodes 3, 4 and whose drain terminal is connected to the source terminal S of power MOSFET 1. Its gate terminal G is coupled to the gate terminal G of power MOSFET 1.

Figure 1:
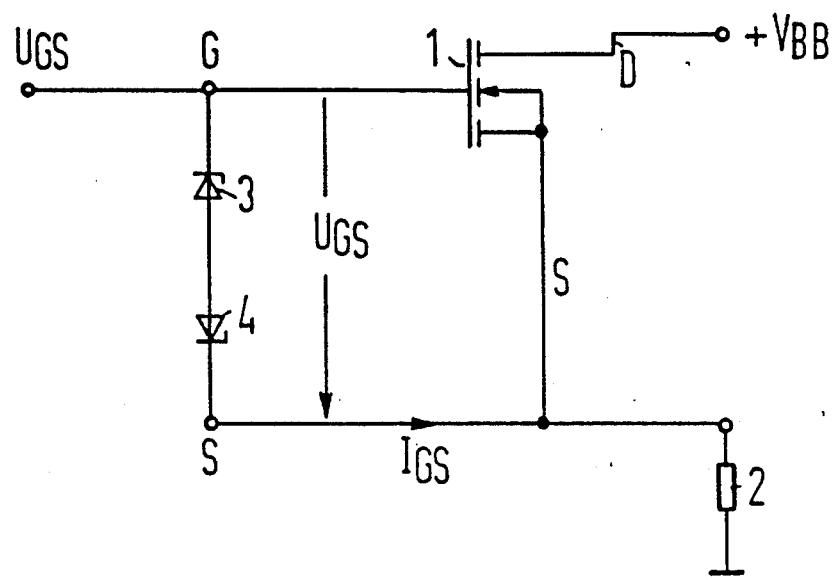
FIG. 1 depicts a gate-source protective circuit for a power MOSFET according to the prior art.
Figure 2:
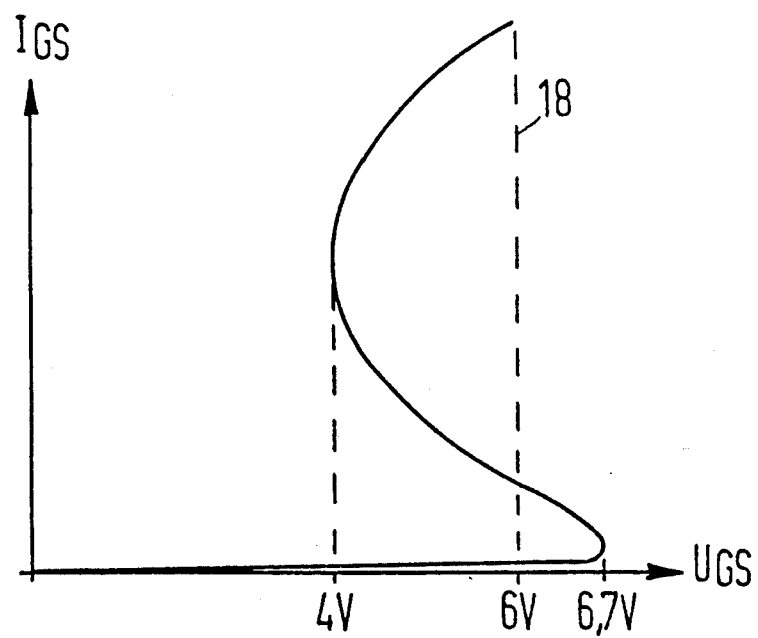
FIG. 2 illustrates a current versus voltage characteristic.
Figure 3:
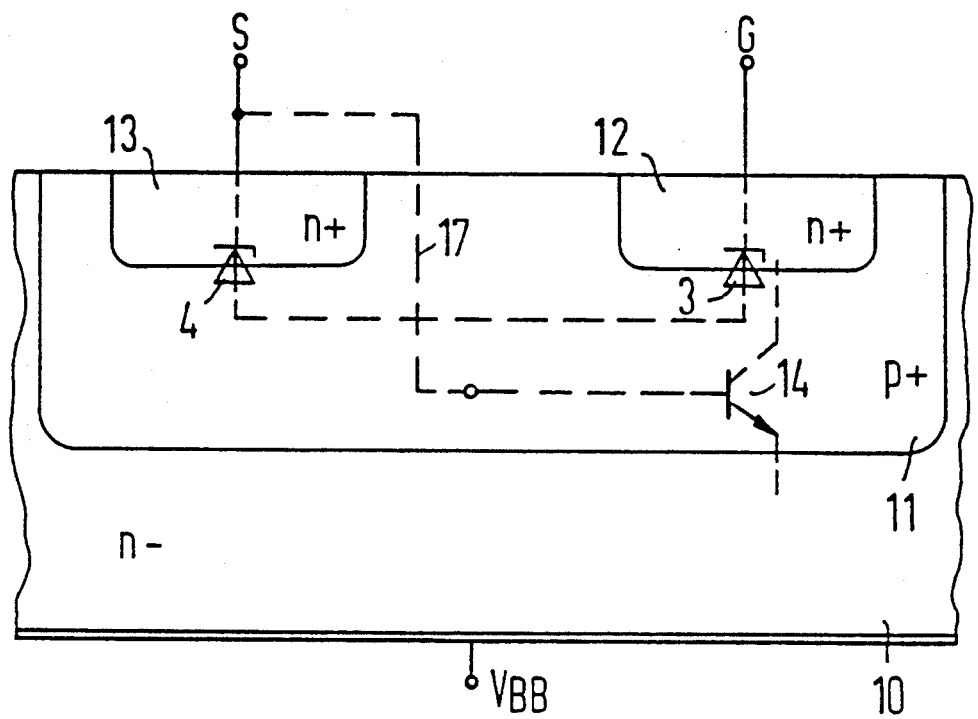
FIG. 3 shows doping zones in a semiconductor substrate.

When a positive gate-source voltage $U_{GS}$ is applied to the input of power MOSFET 1 such that the gate-source voltage is larger than the threshold voltage of FET 15, this FET is rendered conducting and connects the anode terminal of Zener diode 3 to the source terminal S of power MOSFET 1. This means that the base of the parasitic bipolar transistor 14 (FIG. 3) is at the lowest available potential, which is always lower than the emitter potential Thus, the npn bipolar transistor 14 cannot switch on. The connection of the base to the source terminal S is represented symbolically in FIG. 3 as a dotted line 17. Zener diode 3 then has the current-voltage characteristic illustrated by the dotted line 18 in FIG. 2. The threshold voltage of FET 15 is smaller than or equal to the Zener voltage of Zener diode 3.

A depletion FET 16 can be coupled in parallel with MOSFET 15 such that both source terminals, both drain terminals and their gate terminals are coupled to each other. FET 16 is already conducting at $U_{GS}=0$ and it keeps the anode terminals of Zener diodes 3, 4 and region 11 (FIG. 3) at the source potential even when FET 15 has not yet been switched on.

If a negative voltage $U_{GS}$ is applied to the input of MOSFET 1, e.g., by the action of an inductive load, Zener diode 4 has a voltage limiting effect. Transistors 15, 16 are then switched off. The parasitic bipolar transistor assigned to Zener diode 4 does not cause a problem here because when a $U_{GS}<0$ is applied the power MOSFET should not be switched on anyway.

There has thus been shown and described a novel protective circuit which fulfills all the objects and advantages sought therefor. Many changes, modifications, variations and other uses and applications of the subject invention will, however, become apparent to those skilled in the art after considering this specification and the accompanying drawing which disclose an illustrative embodiment thereof. All such changes, modifications, variations and other uses and applications which do not depart from the spirit and scope of the invention are deemed to be covered by the invention which is limited only by the claims which follow.

We claim:

1. A protective circuit for a power MOSFET having a source terminal, a drain terminal and a gate terminal, said protective circuit comprising:
   a) two Zener diodes each having an anode terminal and a cathode terminal, the anode terminals being coupled to each other and the cathode terminal of one of said Zener diodes being coupled to the gate terminal and the cathode of the other of said Zener diodes being coupled to the source terminal of said power MOSFET, and
   b) an electronic switch arranged between the anode terminals of said Zener diodes and the source terminal of said power MOSFET and coupling the anode terminals of said Zener diodes and the source terminal of said power MOSFET when the potential at the gate terminal is higher than that at the source terminal and at the drain terminal.

2. A protective circuit according to claim 1, wherein said electronic switch comprises an enhancement MOSFET having a source terminal, a drain terminal and a gate terminal, said source terminal being coupled to the anode terminals of said Zener diodes, the drain terminal being coupled to the source terminal of said power MOSFET, and the gate terminal being coupled to the gate terminal of said power MOSFET.

3. A protective circuit according to claim 2, wherein a depletion MOSFET is connected in parallel to said enhancement MOSFET, the depletion MOSFET having a source terminal, a drain terminal and a gate terminal, said source terminal, drain terminal and gate terminal being respectively coupled to the source terminal, drain terminal and the gate terminal of said enhancement MOSFET.

* * * * *